Jan. 27, 1959
C. W. DOLLSCHECK
REMOTE CONTROL FOR A SIGNAL TRANSFER
CHANNEL EMPLOYING FEEDBACK MEANS
Filed Feb. 3, 1956
2,871,304
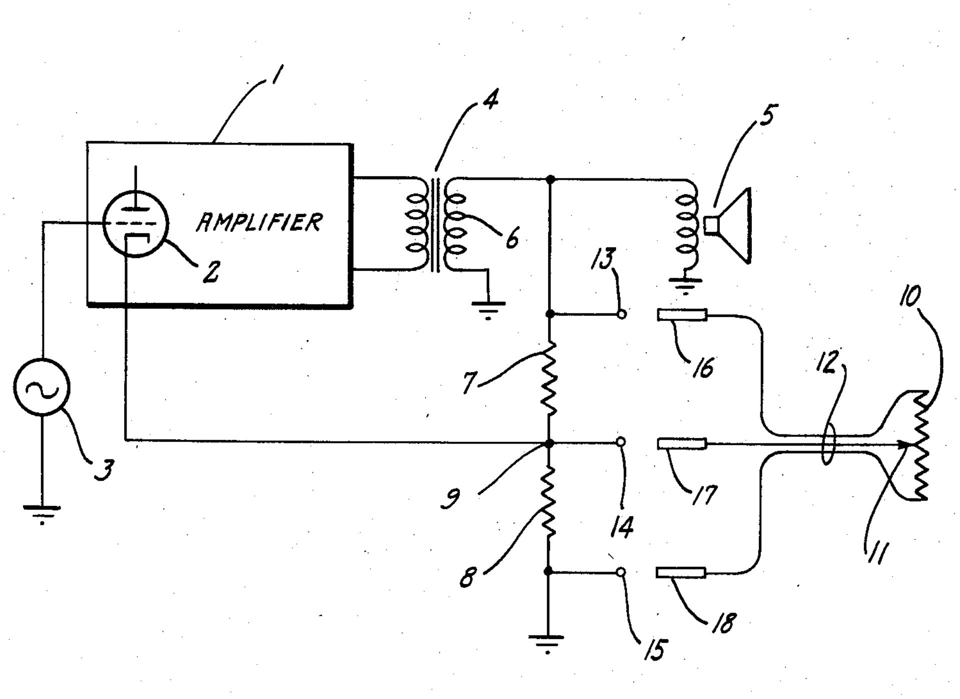
INVENTOR.
CHARLES W. DOLLSCHECK
BY
ATTORNEY United States Patent Office 2,871,304

Patented Jan. 27, 1959

2,871,304

REMOTE CONTROL FOR A SIGNAL TRANSFER CHANNEL EMPLOYING FEEDBACK MEANS

Charles W. Dollscheck, Camden, N. J., assignor to Philco Corporation, Philadelphia, Pa., a corporation of Pennsylvania Application February 3, 1956, Serial No. 563,307

3 Claims. (Cl. 179—171)

This invention relates to signal transfer channels, such as signal amplifier channels, employing feedback means, and more particularly to control of signal amplitude in such a channel from a remote point. The invention is applicable, for example, to remote control of volume in audio amplifier channels, and it will be described with particular reference to such application. Thus the invention may be employed for remote control of the sound volume in a television receiver.

It has been proposed heretofore to effect volume control in an audio amplifier channel by varying the amount of feedback in a feedback circuit associated within the amplifier channel. More particularly, it has been proposed to vary the value of the resistor across which the feedback voltage is developed, thereby to vary the amount of feedback. This enables volume control independently of the normal volume control means. Such an independent volume control means may be utilized for remote control of volume, but this requires adjustment or actuation of the variable resistor from the remote control point through some suitable actuating means such as a mechanical drive arrangement.

The object of the present invention is to provide an arrangement by which remote control of signal amplitude in a signal transfer channel may be effected, through variation of the amount of feedback in a feedback circuit associated with said channel, without requiring actuation of a varaible element of said circuit from the remote control point.

Another object of the invention is to provide a remote control arrangement of this character which is simple and inexpensive.

A further object of the invention is to provide a remote control arrangement in which the remote control means may be connected or disconnected at will without adversely affecting the operation of the system.

Still another object of the invention is to provide a remote control arrangement which utilizes an unshielded low impedance cable between the system proper and the remote control point.

Other objects and features of the invention will be apparent from the following detailed description with reference to the accompanying drawing in which the single figure is a diagrammatic illustration of an audio amplifier system embodying the present invention.

Referring more particularly to the drawing, there is represented at 1 a conventional audio amplifier having at least one vacuum tube 2, to the control grid of which a signal is supplied from source 3. It will be understood that the source 3 is intended to represent any source of audio signal, such as a detector of a radio receiver or of the sound channel of a television receiver, a phonograph pickup, a microphone, etc. The output of the audio amplifier 1 is supplied by way of transformer 4 to a signal utilization means such as the loudspeaker 5. One end of secondary 6 is grounded, and connected thereacross is an impedance means which preferably comprises two resistors 7 and 8 serially connected between the ungrounded side of the output circuit and ground. The junction point 9 between resistors 7 and 8 is connected to the cathode of tube 2.

As thus far described, the system will be recognized as comprising a known degenerative feedback arrangement wherein the signal voltage across resistor 8 is included in the input circuit of tube 2 and serves to vary the gain of the amplifier. The feedback circuit is connected (through ground) to one terminal of the impedance means comprising resistors 7 and 8, and is also connected to a predetermined point 9 on said impedance means. A feedback arrangement of this general character is shown and described in U. S. Patent No. 2,290,084, issued July 14, 1942 to R. B. Albright.

In accordance with the present invention, an impedance means is aadpted to be remotely located, and is adapted to be connected to the aforementioned impedance means to enable remote control of the signal amplitude or volume in the amplifier channel. More particularly, there is provided a resistor 10 having an adjustable contact 11, and means are provided for connecting resistor 10 across the series-connected resistors 7 and 8, and for connecting the contact 11 to the junction point 9. Such means comprises an unshielded low impedance cable 12 of any desired length, and also preferably comprises plug and receptacle connector means for connection or dis-connection of the cable 12 at will. In practice, a 3-prong plug may be employed in conjunction with a 3-receptacle socket. In the diagrammatic illustration, three jacks or receptacles are represented at 13, 14 and 15, and three cooperating contact prongs are represented at 16, 17 and 18. It will be noted that receptacles 13 and 15 are connected to the outer extremities of resistors 7 and 8, while receptacle 14 is connected to the junction point 9. With the prongs inserted in the jacks or receptacles, the ends of resistor 10 are connected to the outer extremities of resistors 7 and 8, and the movable contact 11 is connected to the junction point 9.

By way of example only, resistors 7 and 8 may each have a value of 100 ohms, and resistor 10 may also have a value of 100 ohms. With these assumed values, the operation of the system may be clearly understood from the following discussion.

With the remote control means disconnected, the feedback voltage derived at point 9 will be one-half the total voltage derived across resistors 7 and 8. With the remote control means connected, and with the movable contact 11 positioned at the mid-point of resistor 10, the feedback voltage derived at point 9 will still be one-half of the total voltage derived from the output circuit. Although equal portions of resistor 10 are now effectively in parallel with resistors 7 and 8, this does not change the voltage division in the feedback arrangement.

Suppose now that the adjustable contact 11 is moved upward to a point such that three-fourths of resistor 10 is in parallel with resistor 8 and only one-fourth is in parallel with resistor 7. From the given values, it can readily be determined that the feedback voltage is now approximately two-thirds of the total voltage.

Assume now that the adjustable contact 11 is moved downward to a point such that three-fourths of resistor 10 is in parallel with resistor 7 and only one-fourth is in parallel with resistor 8. From the given values it can readily be determined that approximately one-third of the total voltage is derived at point 9.

Assume now that the adjustable contact 11 is moved to the upper end of resistor 10. Resistor 7 is now effectively short-circuited, and the entire derived voltage is fed back from point 9.

Assume now that the adjustable contact 11 is moved to the lower end of resistor 10. Resistor 8 is now effectively short-circuited, and therefore none of the derived voltage is fed back from point 9.

The above discussion has assumed certain arbitrary adjustments of the contact 11. However, it will be clear that other adjustments of contact 11 will vary the feedback voltage accordingly, and that movement of contact 11 from the lower end of resistor 10 to the upper end thereof will vary the feedback voltage from zero to maximum.

An important advantage of this arrangement is that the system may be used with or without the remote control means, and in order to use the remote control means it is merely necessary to effect plug-in connection of cable 12. Another advantage is that the remote control action is effected electrically without the necessity of transmitting any motion. Another advantage is that this arrangement enables the use of a simple, unshielded low impedance cable which has no adverse effect upon the operation. A further and very important advantage is the simplicity of this remote control arrangement.

While a preferred embodiment of the invention has been illustrated and described, it is to be understood that the invention is not limited thereto but contemplates such modifications and further embodiments as may occur to those skilled in the art.

I claim:

1. In an audio amplifier system, an audio amplifier including at least one electron device having an emitter electrode and a control electrode, an output circuit for said amplifier, a first impedance means connected across said output circuit, a connection between said emitter electrode and an intermediate point of said impedance means, said point dividing said impedance means into two portions, a source of audio signal, a connection between said source and said control electrode, a connection between said source and one terminal of said impedance means, whereby a fractional portion of the output signal voltage across said impedance means is applied degeneratively to the input of said amplifier, and an arrangement for varying said fractional portion from a remote location, comprising a second impedance means adapted to be placed at the remote location, an adjustable contact on said second impedance means, and connections for connecting said second impedance means across said first impedance means and for connecting said adjustable contact to said intermediate point of said first impedance means, whereby adjustment of said contact effects differential variation of the portions of said second impedance means in parallel with the portions of said first impedance means, thus causing different fractional portions of the output signal voltage to appear at said intermediate point of said first impedance means.

2. An audio amplifier system according to claim 1, wherein one side of said output circuit is grounded, said first impedance means is connected between the other side of said output circuit and ground, and said signal source is connected to ground.

3. An audio amplifier system according to claim 1, wherein the last-recited connections include plug-in connector means.

References Cited in the file of this patent

UNITED STATES PATENTS

| | | |
|---|---|---|
| 2,080,554 | Wolff | May 18, 1937 |
| 2,080,581 | Smith | May 18, 1937 |
| 2,374,071 | Barton | Apr. 17, 1945 |
| 2,445,031 | McDonald | July 13, 1948 |

OTHER REFERENCES

Radio and Television News, vol. 48, issue No. 5, November 1952, "Remote Volume Control," by C. Richard Ellis, pp. 64, 65.